United States Patent
Eberle

(10) Patent No.: US 7,653,412 B2
(45) Date of Patent: Jan. 26, 2010

(54) WIRELESS COMMUNICATION DEVICE

(75) Inventor: Wolfgang Eberle, Leuven (BE)

(73) Assignee: IMEC, Leuven (BE)

( * ) Notice: Subject to any disclaimer, the term of this patent is extended or adjusted under 35 U.S.C. 154(b) by 301 days.

(21) Appl. No.: 10/410,512

(22) Filed: Apr. 7, 2003

(65) Prior Publication Data

US 2004/0002308 A1    Jan. 1, 2004

Related U.S. Application Data

(60) Provisional application No. 60/370,642, filed on Apr. 5, 2002.

(51) Int. Cl.
*H04M 1/00* (2006.01)
(52) U.S. Cl. ............... 455/552.1; 455/84; 455/553.1
(58) Field of Classification Search .................. 455/84, 455/74, 93, 522.1, 553.1, 552.1
See application file for complete search history.

(56) References Cited

U.S. PATENT DOCUMENTS

| | | | |
|---|---|---|---|
| 5,627,857 A | 5/1997 | Wilson | |
| 5,825,239 A | 10/1998 | Adal | |
| 5,917,865 A | 6/1999 | Kopmeiners et al. | |
| 6,609,010 B1 * | 8/2003 | Dolle et al. | 455/552.1 |
| 6,785,556 B2 * | 8/2004 | Souissi | 455/557 |
| 6,968,167 B1 * | 11/2005 | Wu et al. | 455/251.1 |
| 7,151,925 B2 * | 12/2006 | Ting et al. | 455/418 |
| 2002/0183013 A1 * | 12/2002 | Auckland et al. | 455/73 |
| 2003/0013482 A1 * | 1/2003 | Brankovic | 455/553 |
| 2003/0060185 A1 * | 3/2003 | Fisher et al. | 455/344 |
| 2003/0109237 A1 * | 6/2003 | Chien et al. | 455/260 |
| 2003/0139147 A1 * | 7/2003 | Shi | 455/82 |
| 2003/0169827 A1 * | 9/2003 | Shi et al. | 375/295 |
| 2005/0164648 A1 * | 7/2005 | Gannholm | 455/84 |

OTHER PUBLICATIONS

IEEE Std 802.11a-1999. *Supplement to IEEE Standard for Information Technology, Telecommunications and Information Exchange Between Systems, Local and Metropolitan Area Networks, Specific Requirements. Part 11: Wireless LAN Medium Access Control (MAC) and Physical Layer (PHY) Specifications. High-speed Physical Layer in the 5 GHz Band* (1999).
ETSI TS 101 475 V1.3.1 (Dec. 2001). Technical Specification. *Broadband Radio Access Networks (BRAN); HIPERLAN Type 2; Physical (PHY) Layer* (2001).

* cited by examiner

*Primary Examiner*—Edward Urban
*Assistant Examiner*—Christian A Hannon
(74) *Attorney, Agent, or Firm*—Knobbe Martens Olson & Bear LLP

(57) ABSTRACT

A wireless communication device is provided. The device comprises a digital circuit, an analog circuit, and a control circuit. The digital circuit is arranged to perform digital processing in a signal path. The analog circuit is arranged to perform analog processing in the signal path. The control circuit is arranged to receive control signals as input and arranged to provide output control signals for the analog circuit.

19 Claims, 12 Drawing Sheets

WIRELESS COMMUNICATION DEVICE

RELATED APPLICATIONS

This application claims priority under 35 U.S.C. §119(e) from provisional application No. 60/370,642 filed Apr. 5, 2002, which is hereby incorporated by reference.

BACKGROUND OF THE INVENTION

1. Field of the Invention

The present invention is related to a transceiver architecture adaptable to the user and/or the environment at minimum power cost.

2. Description of the Related Technology

Analogue and digital designs are still fairly separated. The individual single building blocks are optimized for a single case, being the worst case. Typically, a building block has very little tunability because of the design complexity.

Receiver front-ends for broadband wireless communication, for which wireless LANs are an emerging driver, should provide good sensitivity and high linearity to accommodate various modulation schemes up to 64-QAM. Analogue circuits cannot meet all specifications for the entire receive power range without reconfiguration.

Wireless LANs at 5 GHz, based on orthogonal frequency division multiplex (OFDM), pave the way for further large-scale deployment of high-bit rate data transmission into the home consumer market.

Stringent dynamic range requirement of the analog front-end lead to high cost implementation. For the digital receiver, especially in the case of a non-constant envelope modulation scheme such as OFDM, it is important that the received signal becomes digitized without saturation in the front-end.

A short settling time in which to configure the analog front-end optimally for a temporary receive signal strength at the antenna is needed. Wireless LANs according to the IEEE 802.11a or to the similar HiperLAN/2 standard, provide only short preambles for acquisition purposes.

The multitude of completely analogue feedback solution can neither handle the distributed nature of problem, hence they cannot be fast and precise at the same time, nor offer equivalent controllability.

There are a lot of patents that tackle the problem of optimizing only one parameter in the design, like for example the automatic gain control (e.g. in US005627857A, US005917865A and US005825239A).

SUMMARY OF CERTAIN INVENTIVE ASPECTS OF THE INVENTION

One aspect of the invention provides the design of state of the art wireless communication devices, wherein the front-end is reconfigurable. Another aspect of the invention also provides a solution, allowing lower cost analogue front-ends, while still fulfilling stringent requirements on dynamic range and speed.

Another aspect of the invention provides a wireless communication device. The wireless communication device comprises a digital circuit, an analog circuit a digital circuit, and a control circuit. The digital circuit is arranged to perform digital processing in a signal path. The analog circuit is arranged to perform analog processing in the signal path. The control circuit is arranged to receive control signals as input and to provide output control signals, the control circuit being configured to select a configuration of the analog circuit by applying a step of determining characteristics of a signal in the signal path.

In one embodiment, the analog circuit has a distributed architecture. In one embodiment, the signal characteristics comprises at lease one of signal strength and signal to noise ratio.

The digital circuit is for example an Orthogonal Frequency Division Multiplexing (OFDM), a wideband CDMA (W-CDMA) or a Spatial Division Multiple Access (SDMA) circuit. The analog circuit can e.g. be a RF MEMS device. In any case the analog circuit comprises at least 2 analog elements or a single analog element with two properties that can be controlled.

In one embodiment of the invention, the control circuit comprises a digital subcircuit, arranged to perform computations on the control signals and generate decision signals, and an analog subcircuit, comprising driving circuitry for the analog circuit, whereby the driving circuitry is arranged for being steered by the decision signals.

In one embodiment of the invention, the analog subcircuit comprises driving circuitry for the analog elements.

In one embodiment, there are two kinds of control signals one can encounter at the input of the circuit control device: digital control signals being input from the digital circuit and external control signals.

In one embodiment of the invention, the digital subcircuit is arranged to receive external control signals. The external control signals comprise external characteristics required for the wireless communication, like quality of service information.

Also, the digital subcircuit is arranged for generating decision signals in order to set characteristics of at least two of the analog elements, possibly via the analog subcircuit.

In one embodiment, the digital subcircuit can determine the characteristics of the analog elements based on the digital control signals.

In one embodiment, the digital subcircuit in the control circuit selects a configuration for the analog circuit from a set of predetermined configurations, determined via a constraint multi-objective optimization, by selecting characteristics for the analog elements. Part of the constraints can be defined in terms of required characteristics of the communication link, like e.g. the signal quality. Part of the objectives is defined in terms of the communication device characteristics (power and/or energy consumption for example). The digital subcircuit comprises a memory to store the set of predetermined configurations.

In another embodiment of the invention the wireless communication device is either a transmitting device or a receiving device.

Another aspect of the invention provides a transmitting device comprising a digital circuit, an analog circuit, and a control circuit. The digital circuit is arranged to receive a digital input signal as input and to output a digital output signal, the digital output signal being the input signal after digital processing. The analog circuit is arranged to receive the digital output signal as input and to output an analog output signal (transmit signal), the analog output signal being the digital output signal after analog processing. The control circuit is arranged to receive control signals as input, the control signals comprising digital control signals directly related to the digital output signal, from the digital circuit and/or external control signals and arranged to provide output control signals for the analog circuit, the control circuit being configured to select a configuration of the analog circuit by applying a step of determining characteristics of a version of the input signal.

In one embodiment, the control circuit comprises a digital subcircuit, arranged to perform computations on the digital control signals and to generate decision signals, and an analog subcircuit, comprising driving circuitry for the analog circuit, the driving circuitry arranged to be steered by the decision signals.

In one embodiment, the analog subcircuit comprises driving circuitry for the analog elements. In one embodiment, the digital subcircuit is arranged to receive the external control signals. In one embodiment, the external control signals comprise required characteristics of a transmit signal, being the analog output signal. In one embodiment, the digital subcircuit is arranged to generate decision signals in order to set characteristics of the analog elements via the analog subcircuit. In one embodiment, the digital subcircuit is arranged to generate decision signals to set characteristics of at least two of the analog elements via the analog subcircuit. In one embodiment, the digital subcircuit is arranged to determine the characteristics of the analog elements based on the digital control signals.

Another aspect of the invention provides a device for use in receiving or transmitting wireless communication signals. The device comprises a digital section, an analog section and a control section. The digital section receives control signals relating to external characteristics for the wireless communication. The analog section has at least two controllable elements. The control section receives and processes the control signals to generate decision signals, and sets characteristics of the controllable elements based on the decision signals.

Another aspect of the invention provides a receiving device comprising an analog circuit, a digital circuit and a control circuit. The analog circuit is arranged to receive an input signal and to output an output signal, the output signal being the received input signal after analog processing. The digital circuit is arranged to receive the output signal as input and to output a digital signal, the digital signal being the output signal after digital processing. The control circuit is arranged to receive control signals as input, the control signals comprising digital control signals, related to the received input signal and determined from the digital output signal by estimation, from the digital circuit and/or external control signals and arranged to provide output control signals for the analog circuit, the control circuit being configured for selecting a configuration of the analog circuit by applying a step of determining characteristics of a version of the input signal.

In one embodiment, the analog circuit has a distributed architecture. In one embodiment, the analog circuit comprises at least two analog elements. In one embodiment, the elements are selected from the group comprising analog filters, amplifiers, power amplifiers, up-converters, down-converters, mixers.

In one embodiment, the control circuit comprises a digital subcircuit and an analog subcircuit. The digital subcircuit is arranged to perform computations on the digital control signals and to generate decision signals. The analog subcircuit, comprising driving circuitry for the analog circuit, the driving circuitry arranged for being steered by the decision signals.

In one embodiment, the analog subcircuit comprises driving circuitry for the analog elements, and the digital subcircuit is arranged to receive external control signals. In one embodiment, the external control signals comprise required characteristics of the digital output signal. In one embodiment, the digital subcircuit is arranged to generate decision signals in order to set characteristics of the analog elements via the analog subcircuit. In one embodiment, the digital subcircuit is arranged to generate decision signals to set characteristics of at least two of the analog elements via the analog subcircuit. In one embodiment, the digital subcircuit is arranged to determine the characteristics of the analog elements based on the digital control signals.

Another aspect of the invention provides a control circuit device arranged to have control signals as input and to generate output control signals for an analog circuit.

In one embodiment, the control circuit device further comprises a digital subcircuit, arranged to perform computations on the control signals and to generate decision signals, and an analog subcircuit, comprising driving circuitry for the analog circuit, the driving circuitry being arranged to be steered by the decision signals.

In one embodiment, the analog subcircuit comprises driving circuitry for analog elements. In one embodiment, the digital subcircuit comprises a memory with a set of predetermined configurations, the predetermined configurations being determined via a constraint multi-objective optimization. In one embodiment, part of the constraints is defined in terms of required characteristics of the communication link. In one embodiment, part of the constraints is defined in terms of signal quality. In one embodiment, part of the objective is defined in terms of the communication device characteristics. In one embodiment, part of the objective is defined in terms of power consumption and or energy consumption. In one embodiment, part of the objective is defined in terms of the digital output signal characteristics not being used as constraint.

In one embodiment, the control signals at the input of the circuit control device comprise digital control signals input from the digital circuit and/or external control signals. In one embodiment, the digital subcircuit is arranged to receive the external control signals. In one embodiment, the external control signals comprise external characteristics required for wireless communication. In one embodiment, the external characteristics comprise quality of service characteristics.

In one embodiment, the digital subcircuit is arranged to determine characteristics of at least two of the analog elements based on the digital control signals. In one embodiment, the digital subcircuit is arranged to generate decision signals via the analog subcircuit in order to set characteristics of at least two of the analog elements. In one embodiment, the digital subcircuit is arranged to generate decision signals to set characteristics of at least two of the analog elements via the analog subcircuit.

Another aspect of the invention provides a method of estimating a plurality of characteristics of a received signal and/or distortions imposed by an analog circuit receiving the signal. The method comprises Measuring a digital signal determined as output from the analog circuit, and determining a first estimate of the characteristics. The method also comprises determining based on the first estimates whether improved estimates are obtainable and, if so, selecting function from a predetermined set of functions, to determine a second set of estimates.

In one embodiment, one makes use of the current configuration of the analog device when applying the step of selecting a function.

The configurations can in a particular embodiment be an input to the functions.

Another aspect of the invention provides a method for controlling an analog circuit of a wireless communication device at run time, such that a signal processed by the analog circuit and/or analog circuit itself has desired characteristics. The method comprises inputting the desired characteristics, executing the estimation method as described above, and yielding at least one estimated characteristic. The method also comprises selecting another configuration from a set of predetermined configurations based on the desired characteristics and, if available, the second set of estimates, and setting the configuration of the analog circuit according to the selected configuration.

In one embodiment, the selecting of the configuration in the above method is further based on the selected function.

In one embodiment, the procedures of the method can be executed a plurality of times.

In one embodiment, the procedures of the method are executed until the desired characteristics are met.

Another aspect of the invention provides a programmable device carrier executing program that contains instructions, which when executed, and performs the method of controlling an analog circuit as described above.

DETAILED DESCRIPTION OF CERTAIN EMBODIMENTS OF THE INVENTION

In the approach presented here one wants to merge analog and digital design, thereby benefiting from the ease of digitally controlling adaptive components. Further it is the goal to optimize the system for all cases, giving priority to the more likely cases. At design time the number of parameters as well as their operating range is reduced to the amount necessary for a desired system operating range. Then they are used during run-time. This structure allows both to use a short preamble needed by the receiver and a long initialization phase that can possibly be useful for the transmitter. Such structures can advantageously be applied in multi-mode systems. Multi-mode systems are systems capable of using various modulations and coding schemes. A change of modulation scheme and/or coding scheme results in other desired and even required characteristics and type of signals to be handled by the analog front-end. The adaptation capabilities of the invented device are suited for handling such changes.

Figure 1:
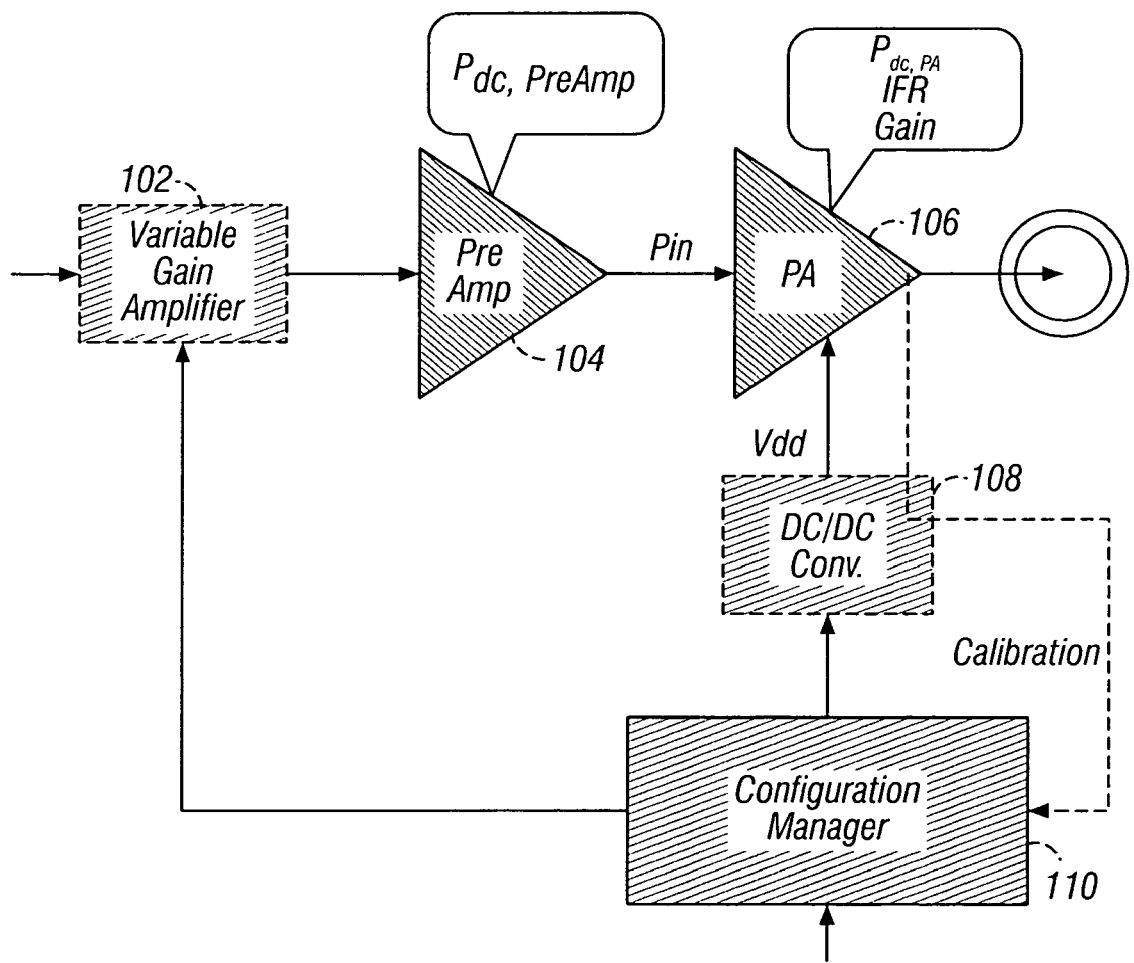
FIG. 1 represents a scheme of a power efficient transmitter with distributed architecture.
Figure 2:
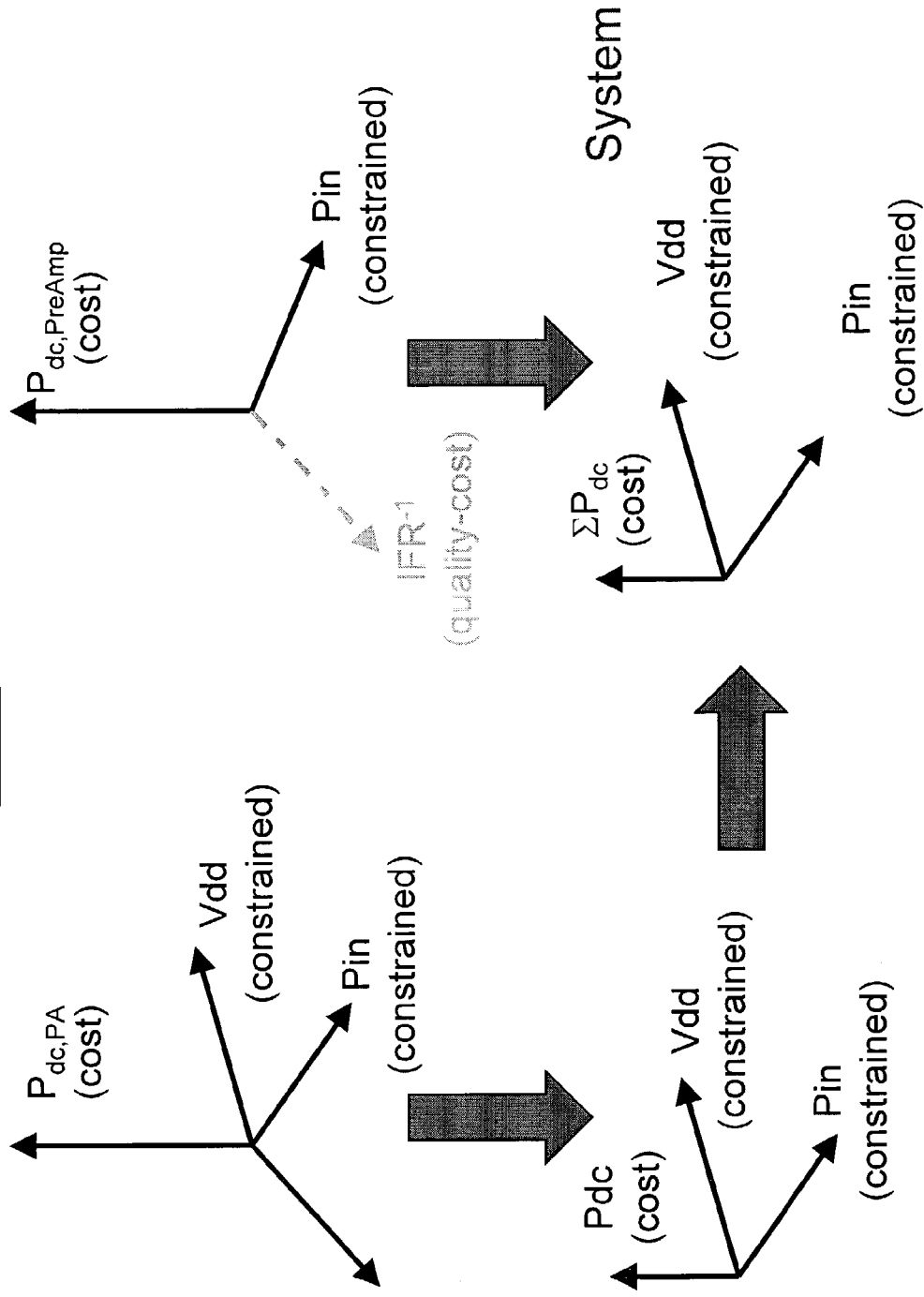
FIG. 2 represents the optimization strategy.

A first general example illustrating the concept is shown in FIG. 1, displaying a scheme of a power efficient transmitter with distributed architecture. A variable gain amplifier 102 is connected to the cascade of a first and a second pre-amplifier 104 and 106, fed by a DC voltage output by a DC/DC converter 108. The gain is one of the parameters determined by a 'configuration manager' 110, which is a controller in the digital domain. This controller generally provides control signals for at least two of a plurality of analog elements or controls at least two parameters of a single analog element. The control signals are either external control signals or digital control signals. The control circuit is configured to select a configuration for the analog circuit. The control circuit comprises a digital subcircuit to perform computations on the digital control signals and to generate decision signals, and an analog subcircuit, comprising driving circuitry for the analog circuit described above. The driving circuitry can be steered by the decision signals. The main challenge is in the application domain. One tries to keep the power amplifiers efficient over a wide range of output power values and over a variety of signal types. At design time the goal is to minimize the component cost by limiting the operating region after exploration of the full design space. At this stage a set of curves is derived via a constraint multi-objective optimization, giving rise to optimum configurations, i.e. a combination of system parameters or (electrical or electromagnetic) characteristics yielding e.g. the maximum achievable S/N ratio. At run-time the efficiency should be maximized by selecting the optimum configuration depending on the user (e.g. a desired service) and on the environment (e.g. the link budget). Therefore an external control signal is used in FIG. 1 to provide to the control device a constraint on the required signal quality (in this case on the signal output power) when setting up the communication link. The output power transmitted by the last amplifier 106 is fed back in a loop containing the configuration manager 110. In order to optimize the system the link is exploited between the device characteristics, the desired signal characteristics and the desired system characteristics. In FIG. 2 the desired system characteristic is the low power $P_{DC}$, the desired signal characteristic is the intermodulation free range (IFR) and the device characteristic is the supply voltage $V_{dd}$. This defines the design space. In given design space one wants to find the configuration corresponding to the minimum quality cost (i.e. maximum quality). By eliminating cost dimensions the search space is narrowed. The procedure is repeated for all elements. Then a final overall optimization is carried out. In this way one obtains the set of curves.

Figure 3:
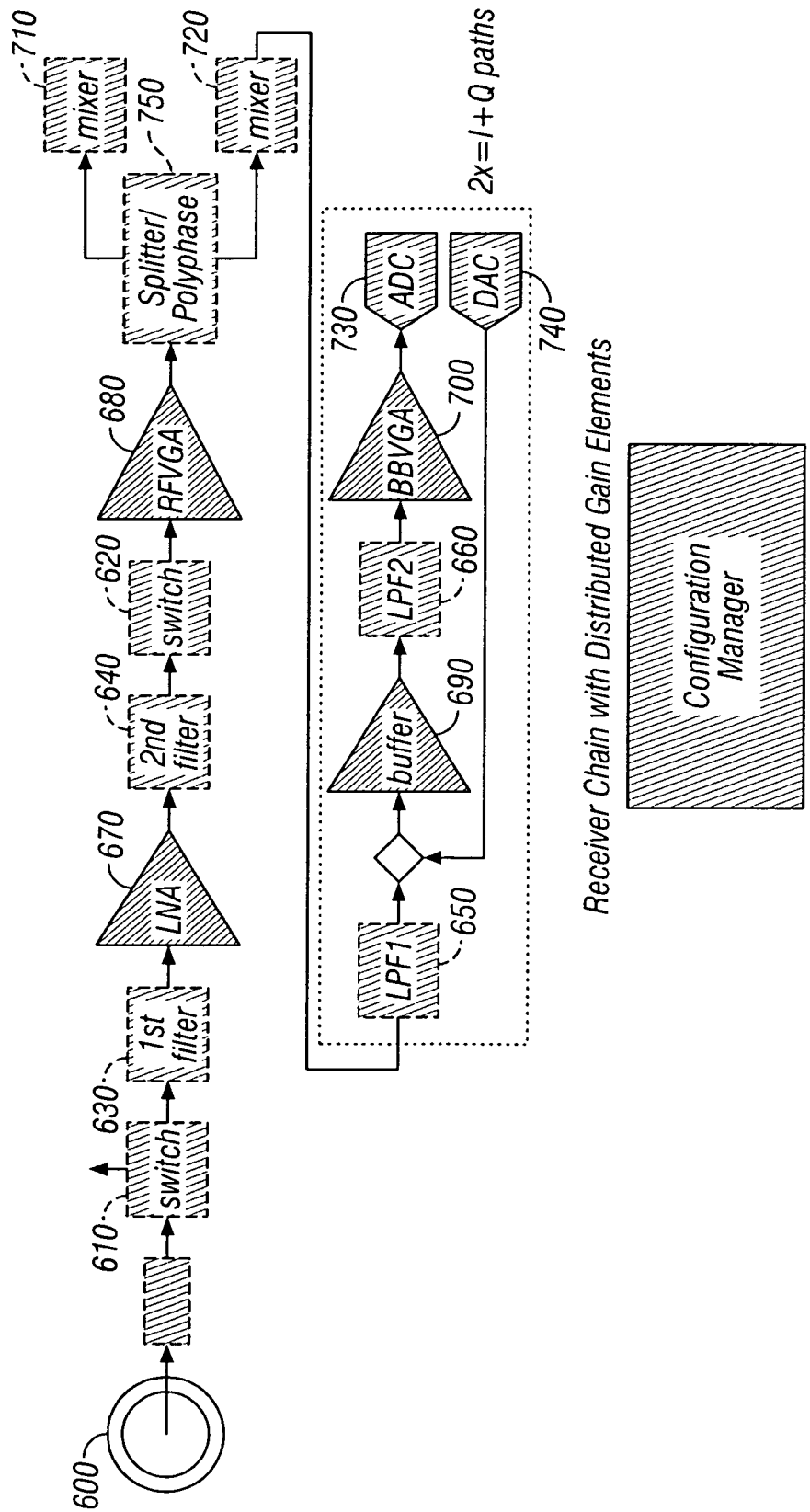
FIG. 3 represents a receiver chain with distributed gain elements.

A second illustration is given in FIG. 3. It deals with the Automatic Gain Control and DC offset removal in a wireless receiver, i.e. again there is more than one functionality to be controlled. A receiver front-end chain is shown with distributed gain elements. Several blocks are used for the same functionality (gain). Reference numeral 600 represents an antenna. Reference numerals 610 and 620 represent switches. Reference numerals 630 and 640 represent first and second filters, respectively. Reference numerals 650 and 660 represent first and second low pass filters, respectively. Reference numerals 670-700 represent amplifiers. Reference numerals 710, 720 represent mixers. Reference numerals 730-750 represent an analog-digital converter, a digital-analog converter, and a splitter, respectively. The D/A converters (740) takes care of the offset compensation functionality. Here the challenge in the application domain is to guarantee a desired receive signal quality over a wide range of input powers with minimum signaling overhead (preamble) at minimum cost. In the design phase the intention is again to minimize the component cost by limiting the operating region after exploration of the design space. At run time one wants to adapt the front-end to the temporary signal strength, trying to converge to the optimum configuration, depending on the user (e.g. desired service) and on the environment (e.g. link budget). The optimization strategy is as follows. At design time one explores the front-end design space including all run-time accessible parameters, finds the optimum front-end configuration for each RF input signal strength.

It is hereby very important to take into account tolerance margins for imperfections in the digital estimation and for tolerances in the analog elements.

Also, one creates a set of predetermined configurations comprising characteristics of the analog elements.

As mentioned before, the configurations are determined via a constraint multi-objective optimization.

At run time a loop process is carried out. First some desired characteristics (e.g. power consumption, signal quality, ...) are set. Next the step is performed of digitally estimating one or more received signal characteristics (in this case signal strength) and/or distortions, like DC offset. The estimating step comprises:

measuring a digital signal determined as output from the analog circuit, determining a first estimate of signal strength and DC offset and determining based on the first estimates whether improved estimates are obtainable and, if so, selecting a function from a predetermined set of functions, to determine a second set of estimates.

The functions can be based on the possible configurations. The function can be linear or non-linear and can further take into account the first estimates as well as the configuration used at that moment.

After applying the above estimation step a new configuration for the analog circuit is selected to minimize the difference between the input desired characteristics and the characteristics expected in the following run. The functions define estimators, which can be based on linear or non-linear estimation techniques. It must be noted however that the step of determining whether improved estimates are obtainable involves a classification step, which is intrinsic also a nonlinear step. Ideally the selected configuration is such that the circuit gets a linear (and thus more easily controllable) behavior. Possibly the final choice of an analog circuit configuration is also based on the selected function. Finally the configuration of the analog circuit is set.

Figure 4:
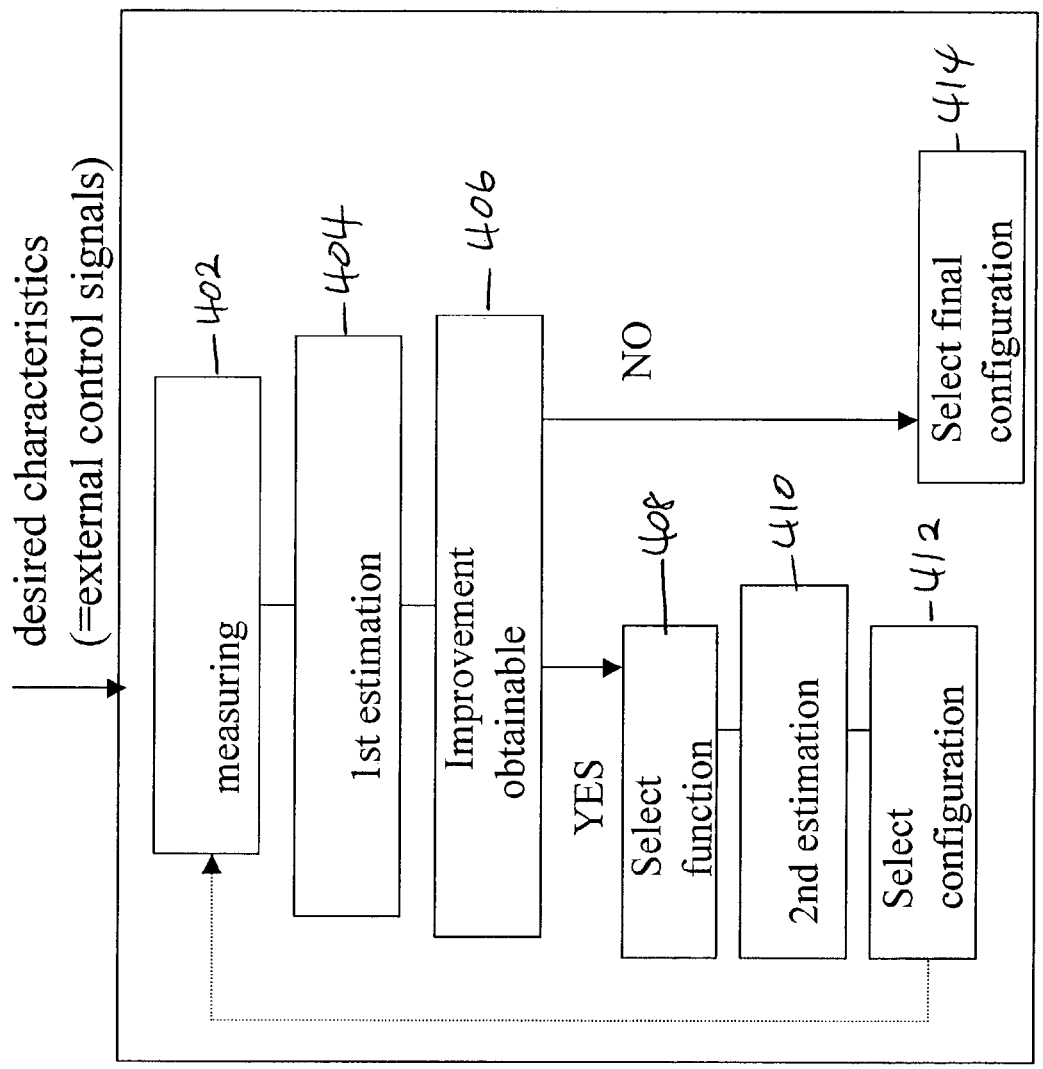
FIG. 4 represents a flow chart of the control method.

FIG. 4 illustrates by means of a flow chart how a configuration is selected. As explained before, first the desired characteristics are set. After measuring a digital signal output by the analog circuit 402, a first estimate is determined 404. Based on the estimates it is decided whether or not improved estimates are obtainable 406. If yes, an estimating function is selected 408, which is subsequently used for a second estimation 410. Latter estimation is then used to select a configuration for the analog circuit to be used in the following iteration 412. In case no improvement can be expected from the first estimation the current configuration is selected as the final configuration setting 414.

Figure 5:
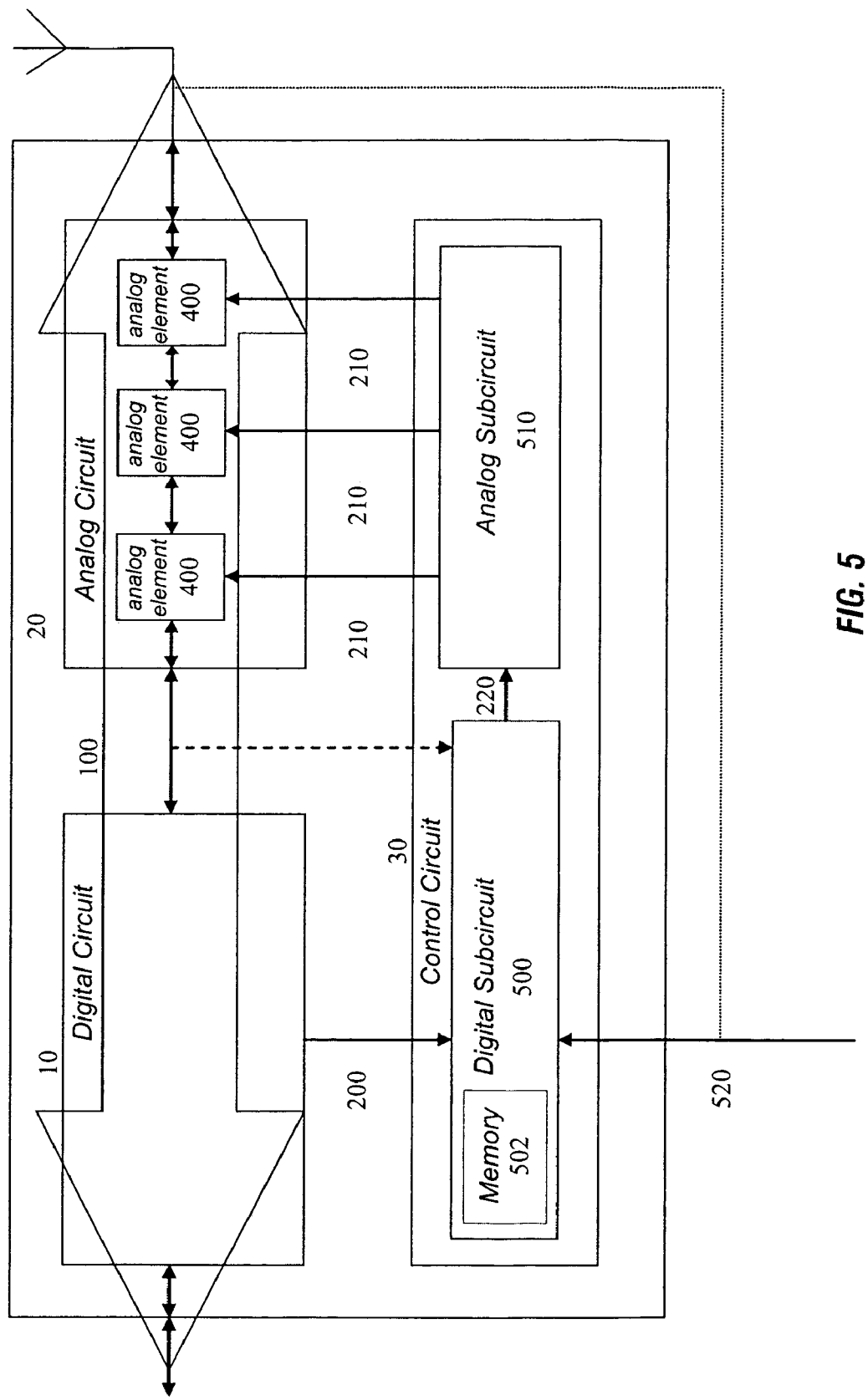
FIG. 5 represents a conceptual drawing on the invention.

The above discussed concepts are applied in the invention which, in its most general embodiment, concerns a wireless communication device as shown in FIG. 5, comprising a digital circuit 10 performing digital processing in the signal path 100, an analog circuit 20 performing analog processing in the signal path 100 and a control circuit 30 acting as a digital-analog transducer, inputting digital control signals 200 from the digital circuit and providing control signals 210 for the analog circuit 20. External control signals 520 can be input as well. The control circuit 30 is configured to select an analog circuit configuration. The analog circuit 20 has a distributed architecture, hence it comprises of a plurality of analog elements 400, such as analog filters, (power) amplifiers, up-converters, down-converters and mixers. It can for example be a RF MEMS device like a switchable capacitor. The digital circuit 10 can e.g. be an OFDM transceiver, a SDMA system or a Wideband CDMA device. The control circuit 30 comprises an analog subcircuit 510 and a digital subcircuit 500, that e.g. can comprise a DSP or a coprocessor.

One embodiment of the invention provides a wireless LAN receiver, to be used in GHz frequency ranges, for instance 5 GHz. The analog part of the receiver has a distributed architecture, more in particular a plurality of amplifiers with variable gain. Also the DC Offset is a parameter, which is changeable. The gains and DC offset are determined via a digital controller. Although the parameter control is formalized as the control of DC offset and amplifier gain in the example, it should be noted it is absolutely not restricted to that.

Linearity requirements on the devices can be reduced by automatic gain control and DC offset compensation. A systematic approach is presented to explore the analog front-end cascade at design-time and one embodiment of the invention proposes an efficient run-time architecture. The latter comprises a front-end configuration control strategy, using information gathered by digital estimation technique. Performance is analyzed theoretically and illustrated for the case of a zero-IF receiver, although not limited thereto.

One embodiment of the invention enables a stringent dynamic range requirement of the analog front-end while avoiding high cost implementation. For the digital receiver, especially in the case of a non-constant envelope modulation scheme like OFDM, it is important the received signal be digitized without front-end saturation.

Figure 6:
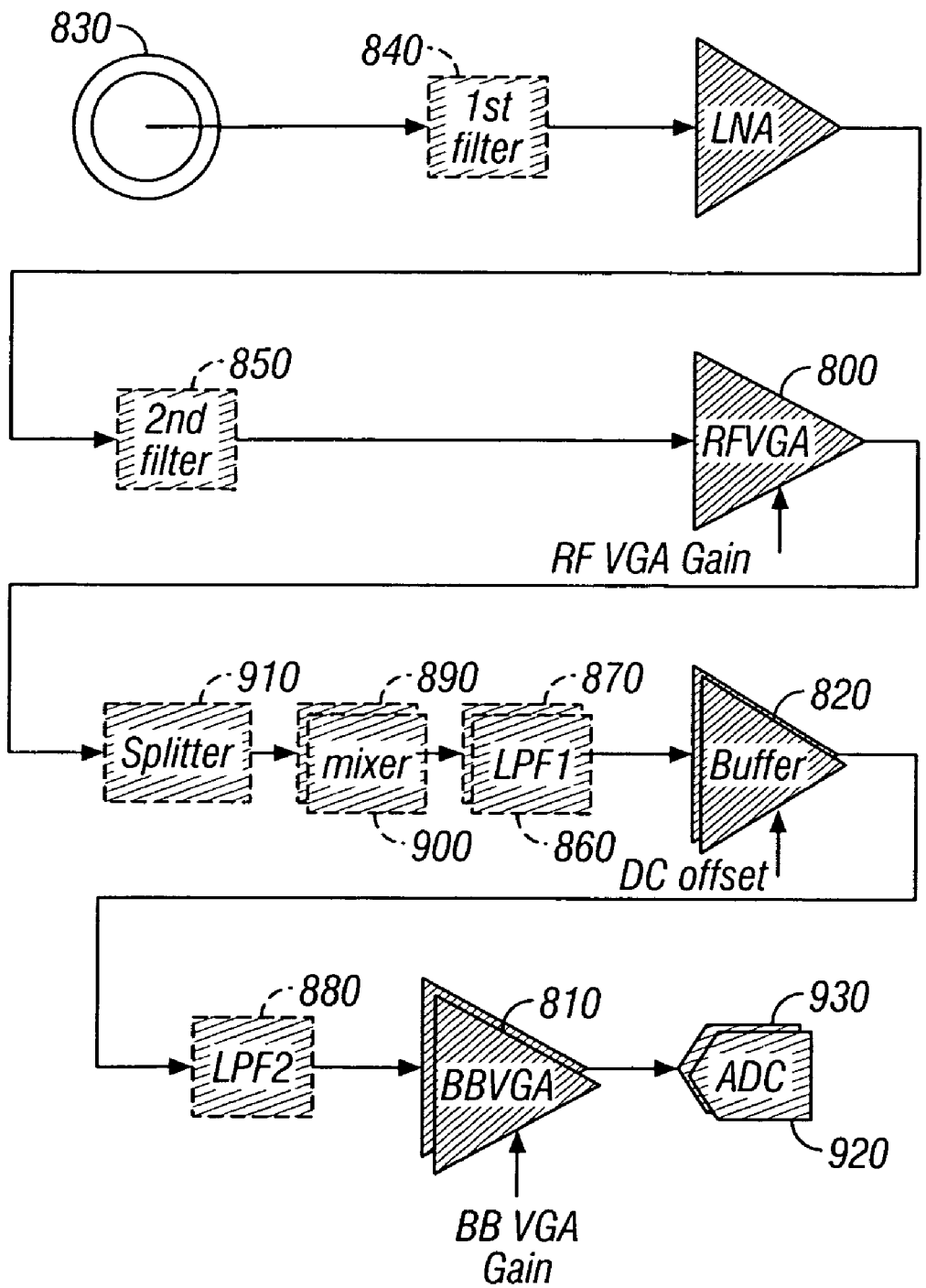
FIG. 6 represents a distributed architecture of a zero-IF front-end, wherein RF VGA, baseband VGA and DC-adjusting buffer are configured by AGC/DCO algorithm.

One embodiment of the invention provides a real front-end with distributed structure with controllable elements for gain adjustment and DC offset removal to avoid such saturation (FIG. 6). Reference numerals 800-820 represent an RF VGA, a baseband VGA, and a DC adjusting buffer, respectively. Reference numeral 830 represents an antenna. Reference numerals 840, 850 represent first and second filters, respectively. Reference numerals 860 and 870 represent first and second low pass filters, respectively. Reference numerals 910-930 represent a splitter, an analog-digital converter, and a digital-analog converter, respectively.

One embodiment of the invention enables a short settling time in which to configure the analog front-end optimally for a temporary receive signal strength at the antenna. Wireless LANs according to the IEEE 802.11a or to the similar HiperLAN/2 standard, provide only short preambles for acquisition purposes, of which roughly 80 samples at 20 MHz sampling rate can be used for automatic gain control (AGC) and DC offset compensation (DCO).

One embodiment of the invention also provides the estimation of the receive signal strength, which is a prerequisite to configure the front-end optimally. The estimation period in the preamble is not only short, but the received signal may also be severely distorted due to compression or DC offsets resulting from I/Q path mismatches or parasitics-dependent self-mixing in the downconversion mixer. In addition, the start of the received sequence is not known nor the effects of convolution of the transmit signal with the radio channel and front-end filters.

The proposed solution presents a complete solution for the AGC/DCO problem but is applicable for various parameters of the analog elements of the front-end. The goal is to reach the optimal front-end configuration for a desired signal quality within the required received signal strength range using only very limited a priori knowledge of the preamble.

In one embodiment of the invention, a (discretely closed) feedback loop between the digital part of the front-end and the analog part is found, the feedback loop is not completely analog, meaning a digital part is found within the feedback loop. The digital part performs computations and takes decisions concerning the analog part of the front end its configuration. The computations are arranged such that no long training phase is required. Further the computations take explicitly into account the non-linearity of the analog part.

An extended design time cascade analysis is proposed to derive the set of optimum front-end configurations. Then, at run time, digital estimation approach for signal strength and DC offset is presented. A three-step compensation strategy along with an optimal gain mapping enables the transition between nonlinear and linear transfer function of the front-end during the acquisition phase.

The derivation of the optimum configuration of the front-end for a specific signal-to-distortion and noise (SNDR) specification requires first a detailed front-end model and an automated cascade analysis at design time. In a second step, one classifies signals at the A/D converter input that have been processed by the receiver front-end.

The cascade analysis follows accurately the architecture as shown in FIG. 6 including parameters such as noise figure, second and third order intermodulation products and frequency selectivity. In addition, one adds DC offset generation mechanisms and considers the input dynamic range of each block such that saturation can be detected at any stage.

The front-end performance space is explored as a function of the received RF input power $P_{RFin}$ and the front-end configuration C. C is a tuple of individual front-end parameters, such as the gain range and the step width of a digitally controlled variable gain amplifier (VGA), including constraint ranges per parameter.

The exploration (FIG. 7) reveals the valid receive range with the signal-to-noise ratio as a quality criterion. Areas where saturation occurs at one or more stages in the receiver or where the SNR is below a given threshold are automatically removed. Note that in FIG. 7 an SNR of 0 indicates an invalid receive configuration (saturation). From FIG. 7 one first identifies an optimum initial configuration $C_{init}$, where maximum sensitivity and SNR is reached at the same time. E.g., the initial optimum is reached for 15 dB baseband VGA gain with the RF VGA in high gain mode (FIG. 7, right plot).

Secondly, the exploration indicates the regions in which the minimum quality-of-service (QoS) requirements are met for a specific transmission scheme, i.e. a certain bit rate and bit error rate. The optimum configuration points will thus be chosen depending on a given quality-cost criterion such as $BER^{-1}$ or SNR.

Figure 7:
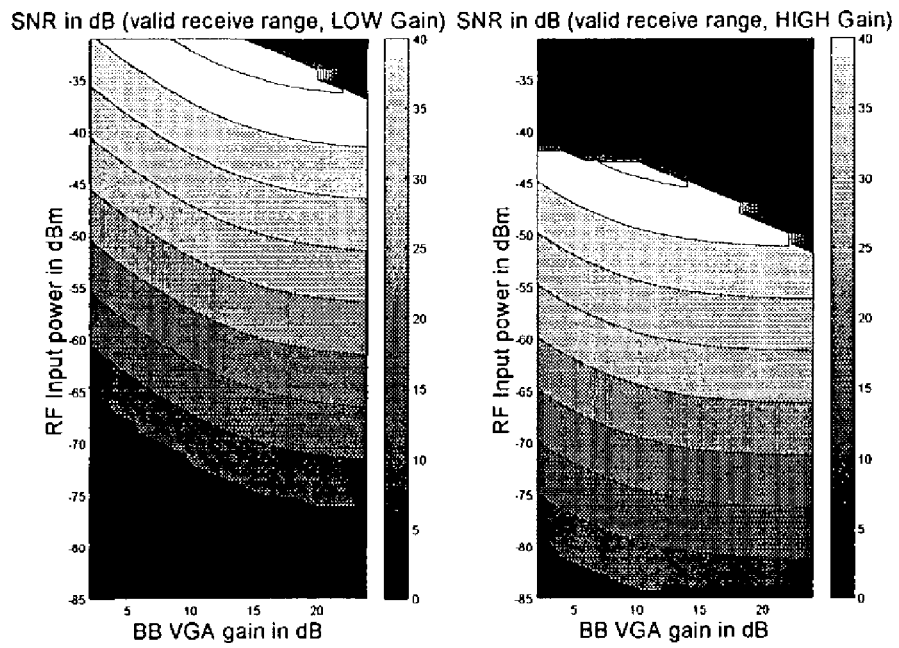
FIG. 7 represents the valid receive range depending on the front-end configuration, here on the RF VGA and the BB VGA setting.

In FIG. 7, there is indeed no single configuration that allows the treatment of all RF input signal levels (−85 to 30 dBm) with acceptable quality (e.g. SNR>12 dB for QPSK). However, one can derive the configuration for each RF input power level to which one would like the AGC/DCO to converge in order to maximize SNR.

Figure 8:
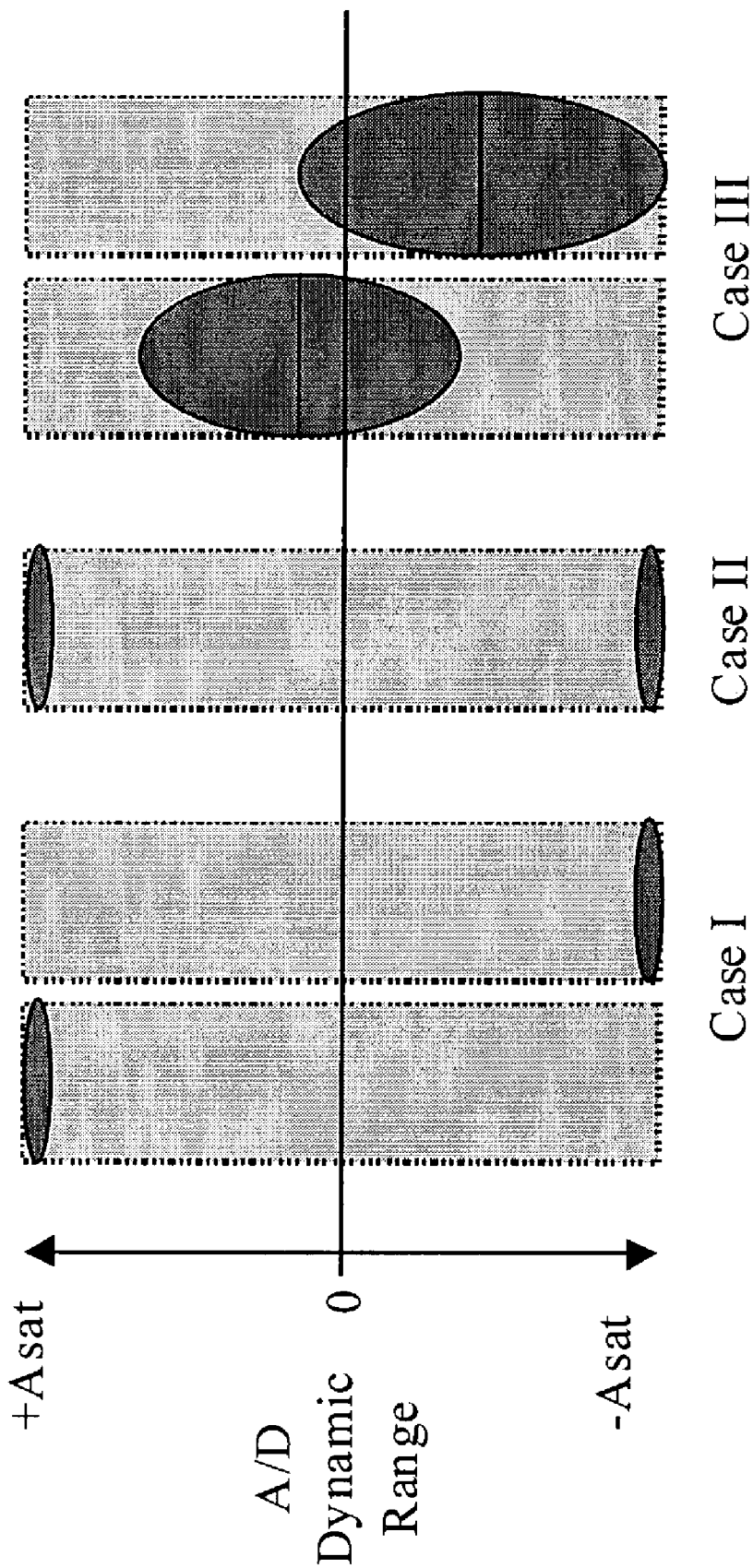
FIG. 8 represents saturation due to DC offset or inadequate gain leading to three different receive scenarios at the ADC.

Three different receive scenarios are distinguished at the A/D converter depending on saturation and the type of saturation. Significant DC offset and high gain introduce saturation at either the positive or negative ADC edge (FIG. 8.I). For minor DC offset but high gain, one faces a rectified waveform (FIG. 8.II). If both DC offset and gain are only slightly sub-optimal, the signal appears in the linear region of the ADC (FIG. 8.III).

The saturation non-linearity in cases I and II introduces a severe bias for linear signal strength estimators. This problem will be addressed later on in the text.

Digital estimation of signal strength and DC offset is advantageous since it allows control of the estimation time and synchronization between estimation and compensation phases, especially beneficial in the context of the short WLAN preamble. In contrary to a closed-loop compensation, the digitally controlled loop is open during estimation and closed at discrete time steps. The settling time of the front-end elements is taken into account as compensation delays in the order of 300 ns (6 samples) per adjustment. This avoids transients and spurs from the adjustment process influencing the following estimation.

One first analyzes the signal properties of the received preambles. Then, a joint estimation is proposed of signal strength and DC offset, adapted to the receive process. This description is concluded with an analysis of the performance and implementation complexity of the estimators.

When analyzing the difference between the IEEE and HiperLAN/2 preambles, one can conclude that the main difference is the max-to-min power ratio which is more favorable for HiperLAN/2. While this holds at the transmit side, at the receive side the preamble appears convoluted with channel and both transmit and receive front-end transfer functions. Simulations show that, in good agreement, the I/Q signals themselves follow a zero-mean normal distribution. The short preamble, especially in case of severe saturation, does not allow successful detection of other preamble properties (e.g. using autocorrelation) before AGC. Thus, the estimator will only use the zero-mean, symmetric amplitude distribution as a priori knowledge.

Using only the signal assumptions from the preamble discussion, the minimum mean-square error (MMSE) estimators are derived with an estimation length of L samples for a DC-offset compensated signal strength $P_{m,i+q,corr}$, $$P_{m,i+q,corr} = -D_{m,i}D_{m,q} + \left(\frac{1}{L}\sum_{k=0}^{L-1} si_{m-k}^2 + sq_{m-k}^2\right) \quad \text{(formula 1)}$$

and DC offsets $D_{m,\{i,q\}}$, $$D_{m,\{i,q\}} = \frac{1}{L}\sum_{k=0}^{L-1} s\{i,q\}_{m-k} \quad \text{(formula 2)}$$

where m indicates the index of the first estimation sample in time. The estimators work on ADC input samples $si_{m-k}$ and $sq_{m-k}$, sampled e.g. at 20 MHz. DC offsets on I and Q are estimated separately. By subtracting the product from the signal strength estimate, the DC-related bias on the signal strength estimate are reduced.

To investigate the performance of the estimators in the linear region, an additional lumped additive white Gaussian noise source with power N integrated over the signal band-width is considered producing noise samples $n_{m-k}$. Preamble signal power is denoted as S and DC offset power as $d_i^2$ and $d_q^2$, respectively. From $$D_{m,\{i,q\}} = \frac{1}{L}\sum_{k=0}^{L-1} s\{i, q\}_{m-k} + d_{\{i,q\},m-k} + n_{m-k} \quad \text{(formula 3)}$$

and the DC-free signal properties of signal and noise follows that the DC estimator is unbiased, $$E\{D_{m,\{i,q\}}\} = d_{\{i,q\}} \quad \text{(formula 4)}$$

Both signal and noise power increase the variance $$\text{var}\{D_{m,\{i,q\}}\} = \frac{1}{L}(S + N) \quad \text{(formula 5)}$$

of the estimator, since one can not exploit any further knowledge on the preamble characteristics.

The signal strength estimator $$P_{m,i+q,corr} = -D_{m,i}D_{m,q} + \quad \text{(formula 6)}$$
$$\frac{1}{L}\sum_{k=0}^{L-1}(si_{m-k} + di_{m-k} + ni_{m-k})(sq_{m-k} + di_{m-k} + ni_{m-k})$$

requires compensation based on the DC estimates to remain unbiased:

$$E\{P_{m,i+q,corr}\} = -di\,dq + \frac{1}{L}(LS + Ldi \cdot dq) = S \quad \text{(formula 7)}$$

The variance of the estimate reaches it maximum for equal DC offsets $d=d_i=d_q$. The variance of the estimator $$\text{var}\{P_{m,i+q,corr}\} = \frac{1}{L}(N(S + N) + 2d^2(S + N)) \quad \text{(formula 8)}$$

indicates that both DC offset, noise, and the signal power reduce the performance of the estimator.

As expected for the MMSE approach, the SNR for both estimators increases linearly with the estimator length L. Estimator lengths of L=12 (initial estimates) to 24 (fine estimate) provide sufficient S/N to obtain an estimation accuracy in the order of +/−1.5 to 3 dB.

Figure 9:
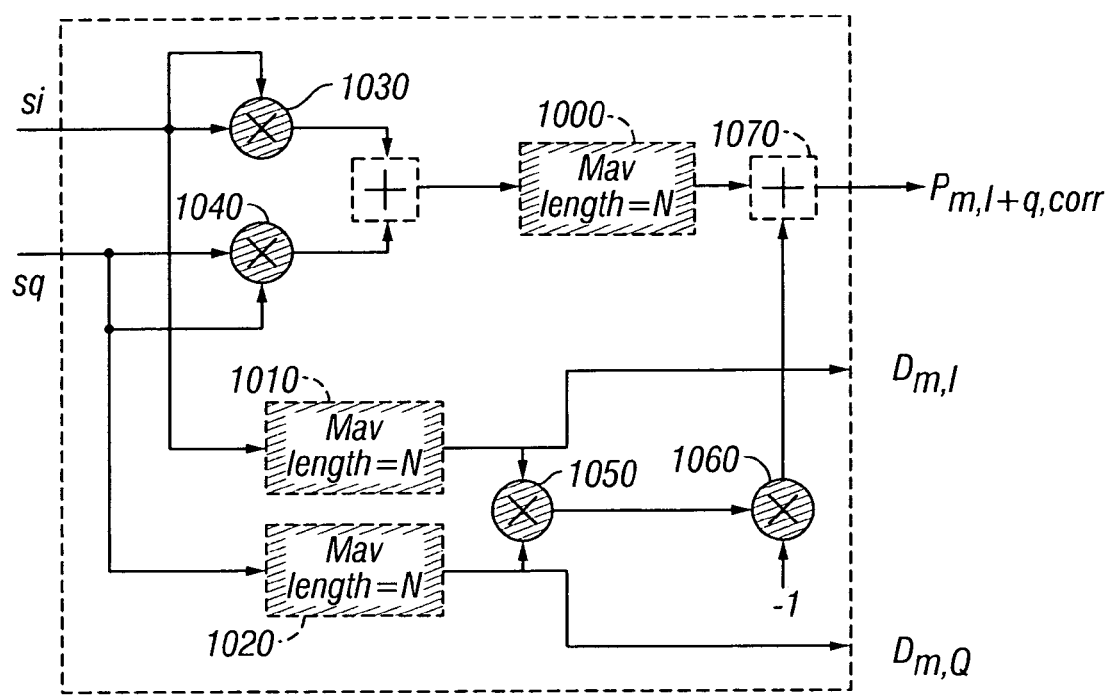
FIG. 9 represents the low complexity of the DC-compensated signal power estimator lending itself to implementation.

For implementation in integrated circuits, circuit complexity and power consumption are important. The estimator architecture (FIG. 9) requires only two multiply-accumulate (MAC) stages, two accumulators and a single multiplier for the DC path. Reference numerals 1000-1020 represent moving average blocks. Reference numerals 1030-1060 represent multipliers. Reference numeral 1070 represents a summer.

The estimators can be implemented as moving-averages (MAV) or block-based accumulators. For the targeted estimation accuracy, multiplication in the signal strength path can also be replaced by less accurate, but multiplier-free min/max power estimation.

The estimators derived provide the estimates of signal strength and DC offset. The control approach still lacks the run-time compensation path to adjust gain and DC offset using the configurable front-end elements, derived at design-time.

The different receive scenarios described before indicated already, that, besides the estimation, one has to decide to which class a detected A/D input signal belongs. Therefore, a three-phase compensation approach is applied describing the transition conditions between the classes. This is completed by a gain mapping algorithm that optimally traverses the front-end configuration space from an initial configuration at start-up to the global optimum.

Figure 10:
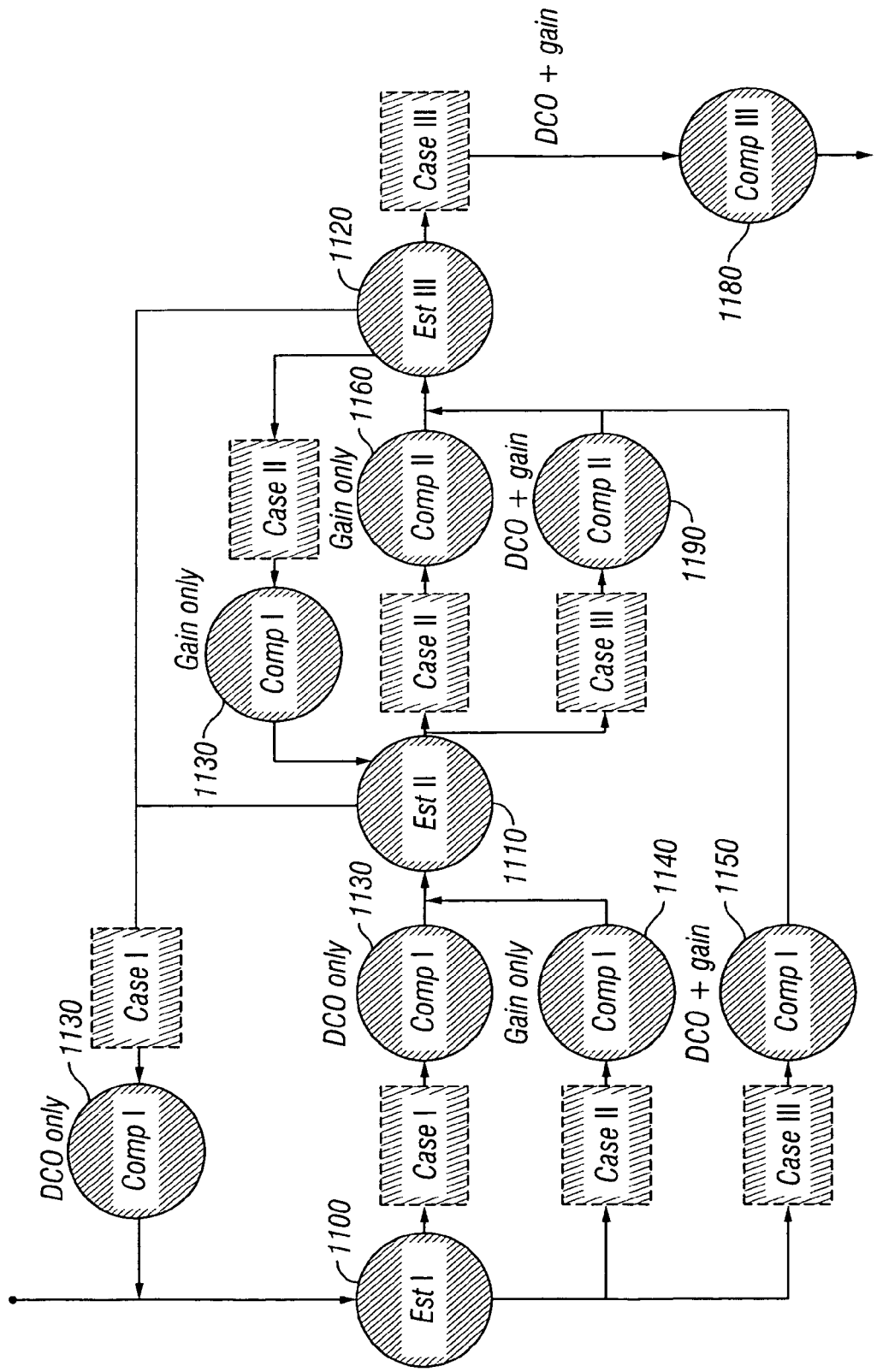
FIG. 10 shows the AGC/DCO process consists of three interleaved estimation and compensation phases with transitions dependent on estimated DC offset, signal power and current front-end configuration.

The AGC/DCO strategy uses up to 80 samples of the short training symbols part of the preamble and partitions them into three pairs of estimation and compensation phases (ECPs) (FIG. 10). Reference numerals 1100-1120 represent a sequence of estimation. Reference numerals 1130-1180 represent case-based compensation phases. One reserves the other half of the STS for coarse timing and carrier-frequency offset. The first estimation (1100) will thus start with maximum front-end gain to detect weakest possible signals (highest sensitivity level) and thus face, with a high probability, a signal- and DC-offset saturated signal at the ADC (case I).

The first ECP mainly targets DC offset removal. Analysis of typical ZIF architectures shows that the worst-case DC offset does not exceed the dynamic range of a 1V ADC by more than +/−½ MSB for maximum gain. Using a binary search tree to converge to the optimum DC removal level, only two input regions are to be investigated. Thus a single decision is sufficient to leave the DCO saturation region.

If within specifications, case II is thus reached, where a second ECP tries to bring the input signal from nonlinear saturation to the linear range. The third and final ECP can then use linear operations to directly set the front-end configuration to a reliable optimum maximizing SNR.

Such a partitioning is required to allow a treatment adapted to the specific signal properties in each phase. A first aspect is the shortened estimation time for phase I since saturation will lead inevitably to a biased gain estimate. Secondly, one can apply different transition strategies for the reconfiguration of the front-end resources, which will be described next.

The problem of automatic gain control is to converge as fast as possible to the optimum front-end configuration for a given quality factor. Before the optimum initial and the optimum final configuration was derived from an extended cascade analysis. If one enumerates the ECPs with index k, starting from the initial configuration $c_0 = (g_0, \ldots, _{N-1})_0$, a function $\Psi(\hat{P}_{adc,k}, \hat{d}_{adc,k}, C_k = (g_0, \ldots, _{N-1})_k)$ is needed describing the reconfiguration from phase k to k+1, $$C_{k+1} = (g_0, \ldots, _{N-1})_{k+1} = \Psi(P_{adc,k}, D_{adc,k}, C_k = (g_0, \ldots, _{N-1})_k) \quad \text{(formula 9)}$$

whereby $g_0, \ldots, _{N-1}$ denote the gain settings for the individual gain components in the front-end. To adjust these gains, one computes first the RF input signal power from the current configuration $C_k$ and the signal strength estimate. An unbiased, linear computation is only possible for case III, however. Cases I and II are treated separately, where the signal strength estimate is likely biased due to the non-linearity, such that one cannot compute the RF input power at the antenna linearly from the signal strength estimate.

If $P_{adc,k} < P_{adc,max}$ − Backoff (linear case), (formula 10)

$$\left(\sum_{n=0}^{N-1} g_n\right)_{k+1} = \max\left\{\begin{array}{l}\min_{range}\left(\sum_{n=0}^{N-1} g_n\right), \\ \min\left\{\min_{range}\left(\sum_{n=0}^{N-1} g_n\right), P_{desired,adc} - P_{adc,k} + \left(\sum_{n=0}^{N-1} g_n\right)_k\right\}\end{array}\right\}$$

else, including a forgetting factor $w$ (saturation case):

$$\left(\sum_{n=0}^{N-1} g_n\right)_{k+1} = \frac{1}{w+1}\left(w\left(\sum_{n=0}^{N-1} g_n\right)_k + \min_{range}\left(\sum_{n=0}^{N-1} g_n\right)\right) \quad \text{(formula 11)}$$

A simple threshold-dependent algorithm, with a linear, min/max bounded path (if case) is used for case III while in potential saturation (else case), the previous gain setting is less considered in the computation of the new configuration. Instead the other extreme case (minimum gain) is tried.

Figure 12:
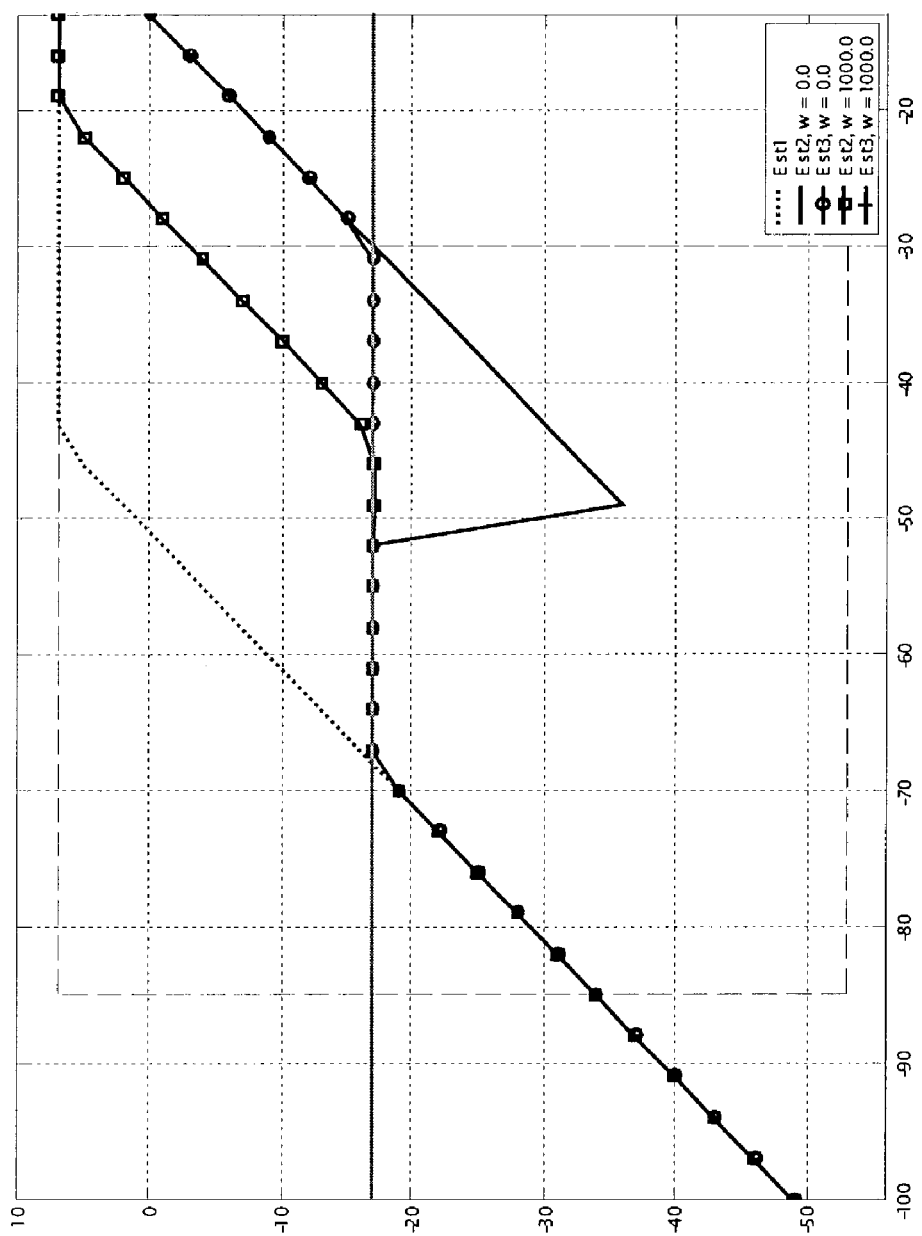
FIG. 12 represents dynamics of the signal power at the ADC for 3 estimation and 2 gain compensation steps (horizontal line: desired settling power level).

Thus, the algorithm in (formula 10) trades off linear computation for binary-tree search, controlled by the forgetting factor w. Again, for the RF input power range of 55 dB compared to the ADC, one can assume that a single step between maximum and minimum gain is sufficient to reach the linear region. A higher w reduces the impact of the previous gain setting (FIG. 12), increasing the RF input power convergence range. This is useful if high saturation is possible.

Figure 11:
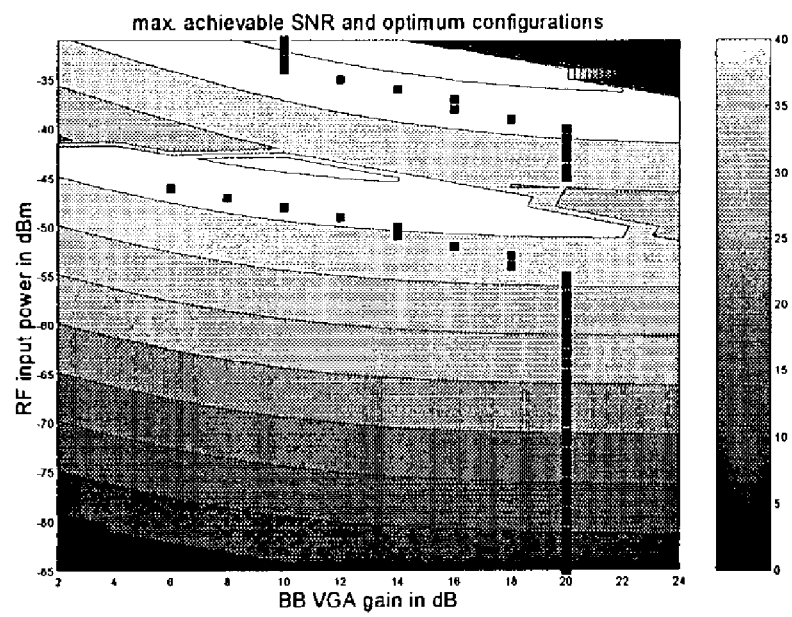
FIG. 11 represents the optimum configuration (black boxes) for each RF input power level as a function of RF VGA gain (upper section =low gain) and BB VGA gain.

From (formula 10) one obtains the total required gain in the front-end, from which the RF input power is estimated. The RF input power estimate is used as an index to fetch the optimum configuration (FIG. 11).

The three main results are analyzed now. Results are based on simulations in MATLAB using front-end specifications from IC designs. First, the front-end is analyzed in an extended cascade-analysis in-the-loop. The optimum initial and final gain configurations for the SNR are derived as quality criterion (FIG. 11).

Secondly, an AGC/DCO strategy is introduced based on digital estimation and a three-phase dynamic estimation & compensation phase (ECP) approach. Each ECP phase improves the difference of the ADC input power to the desired input level, converging to the desired level after the second compensation for the entire RF input range.

Figure 13:
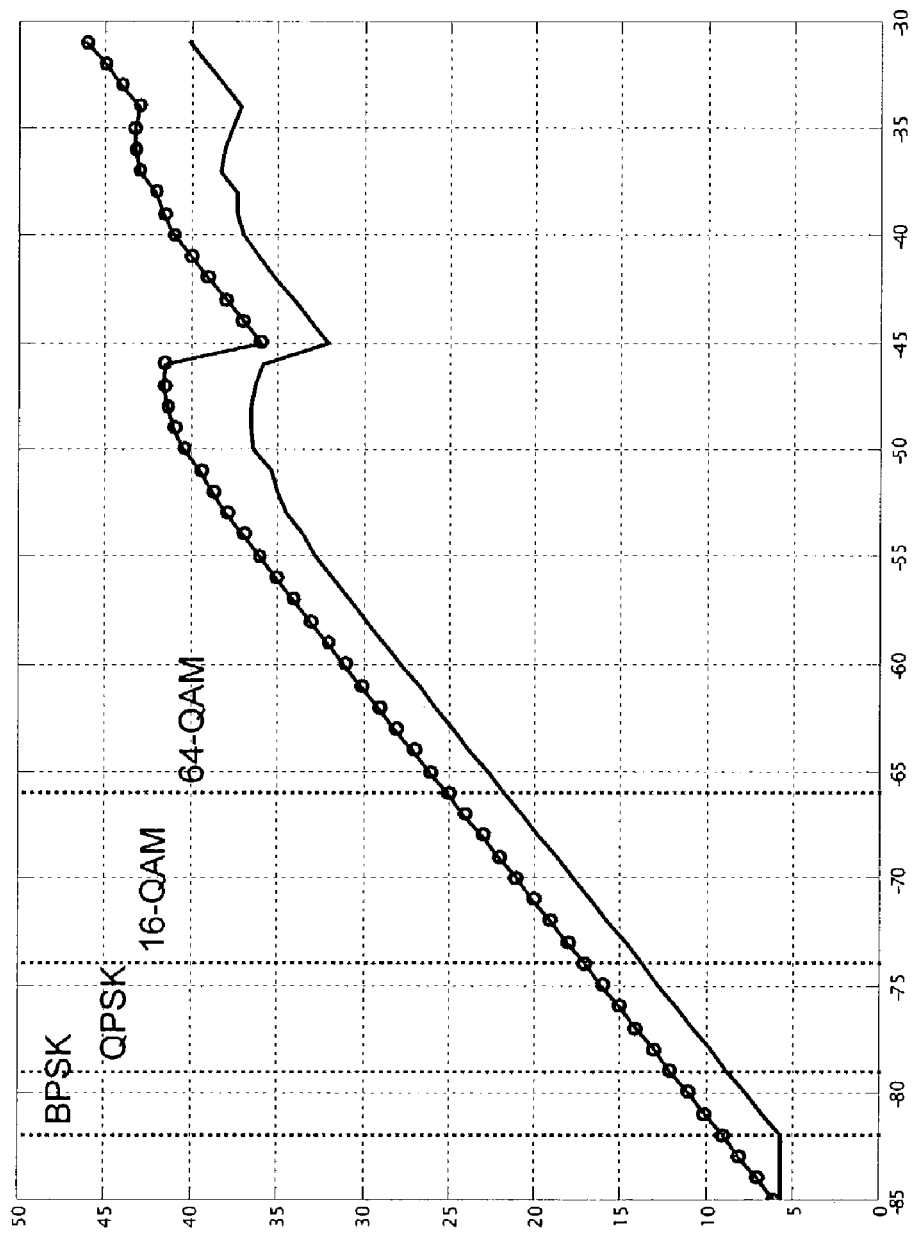
FIG. 13 shows the AGC meets the specifications for all modulation schemes: for 64-QAM, it provides at least 22 dB (thin line) and max. 26 dB (line with marks) at the sensitivity level of −65 dBm RF input power.

FIG. 13 verifies that the strategy achieves an acceptable SNR level for all modulation schemes. Tolerances for the gain elements and the estimation were introduced during the determination of the optimum configurations to avoid accidental saturation to reflect analog component tolerances and estimator variance.

A systematic approach was presented solving the sensitivity/linearity problem of analog receivers by automatic gain control and DC offset compensation. The method first analyzes the optimum configuration range at design-time. An architecture was proposed consisting of a run-time controller handling all saturation scenarios and a configuration mapper using both run-time information obtained from computationally efficient estimators and design-time information from a systematic front-end cascade analysis.

Even if only demonstrated with a zero-IF receiver for wireless LAN, the method 0ology is applicable to other types of receivers. The resulting architecture is generic enough to support different front-ends by simply reprogramming mapping characteristics and preamble timing.

The mapping characteristics support also the optimum configuration of the receiver front-end in terms of a desired quality-of-service (QoS) level. This was illustrated with desired SNR for a set of modulation schemes as QoS parameter, meeting the specifications defined in IEEE 802.11a.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

The invention claimed is:

1. A wireless communication device, comprising:
   a digital circuit arranged to perform digital processing on a signal in a signal path;
   an analog circuit arranged to perform analog processing on a signal in the signal path; and
   a control circuit arranged to receive control signals as input and to provide output control signals for the analog circuit, the control signals at the input of the control circuit comprising digital control signals input from the digital circuit and external control signals, the control circuit being configured to measure determining characteristics of the signal and to select a configuration of the analog circuit from a set of predetermined configurations based on the external control signals and the determining characteristics of the signal, the determining characteristics of the signal being imposed by the analog circuit, the control circuit comprising:
   a digital subcircuit arranged to perform computations on the control signals and to generate decision signals, the digital subcircuit comprising a memory with the set of predetermined configurations, the predetermined configurations being determined via a constrained multi-objective optimization; and
   an analog subcircuit comprising driving circuitry for the analog circuit, the driving circuitry arranged to be steered by the decision signals.

2. The device of claim 1, wherein the digital circuit comprises one of the following: an Orthogonal Frequency Division Multiplexing (OFDM) circuit, a Spatial Division Multiple Access (SDMA) circuit, or a Wideband Code Division Multiple Access (W-CDMA) circuit.

3. The device of claim 1, wherein the analog circuit has a distributed architecture.

4. The device of claim 1, wherein the analog circuit includes a RF Micro Electro-Mechanical System (MEMS) device.

5. The device of claim 1, wherein the analog circuit comprises at least two analog elements or wherein at least two properties of a single analog element can be controlled.

6. The device of claim 5, wherein the elements comprises at least one of the following: amplifiers, power amplifiers, up-converters, down-converters or mixers.

7. The device of claim 5, wherein the elements comprises at least one of the following: analog filters, amplifiers, power amplifiers, up-converters, down-converters or mixers.

8. The device of claim 5, wherein the digital subcircuit is arranged to generate decision signals in order to set characteristics of the analog elements via the analog subcircuit.

9. The device of claim 5, wherein the digital subcircuit is arranged to determine the characteristics of the analog elements based on the control signals.

10. The device of claim 1, wherein the analog subcircuit additionally comprises driving circuitry for the analog elements.

11. The device of claim 1, wherein the digital subcircuit is arranged to receive external control signals.

12. The device of claim 1, wherein the determining characteristics of the signal comprise at least one of signal strength and signal to noise ratio.

13. The device of claim 1, wherein at least part of the constraints for the constrained multi-objective optimization is defined in terms of required characteristics of the communication link.

14. The device of claim 13, wherein one of the required characteristics of the communication link is signal quality.

15. The device of claim 1, wherein at least part of the objective for the constrained multi-objective optimization is defined in terms of the communicating device characteristics.

16. The device of claim 15, wherein the communicating device characteristics comprises power consumption and/or energy consumption.

17. The device of claim 1, wherein the set of predetermined configurations have been determined by estimating a plurality of characteristics, of a received signal and/or distortions imposed by the analog circuit receiving the signal.

18. The device of claim 1, wherein the control circuit is configured to select a configuration of the analog circuit at run-time such that the signal processed by the analog circuit and/or analog circuit itself has desired characteristics.

19. The device of claim 1, wherein the determining characteristics of the signal comprise distortions imposed by the analog circuit.

* * * * *

UNITED STATES PATENT AND TRADEMARK OFFICE
CERTIFICATE OF CORRECTION

PATENT NO. : 7,653,412 B2  Page 1 of 1
APPLICATION NO. : 10/410512
DATED : January 26, 2010
INVENTOR(S) : Wolfgang Eberle It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 563 days.

Signed and Sealed this

Twenty-third Day of November, 2010

David J. Kappos
*Director of the United States Patent and Trademark Office*